United States Patent [19]

Seidler

[11] Patent Number: 5,441,430

[45] Date of Patent: Aug. 15, 1995

[54] ELECTRICAL LEAD FOR SURFACE MOUNTING OF SUBSTRATES

[75] Inventor: Jack Seidler, Flushing, N.Y.

[73] Assignee: North American Specialties Corporation, Flushing, N.Y.

[21] Appl. No.: 223,716

[22] Filed: Apr. 6, 1994

[51] Int. Cl.[6] ............................................. H01R 4/02
[52] U.S. Cl. .................................................... 439/876
[58] Field of Search ................................. 439/83, 876

[56] References Cited

U.S. PATENT DOCUMENTS

| 4,085,998 | 4/1978 | Owens | 439/876 X |
| 5,246,391 | 9/1993 | Seidler | 439/876 |

Primary Examiner—Eugene F. Desmond
Attorney, Agent, or Firm—Darby & Darby

[57] ABSTRACT

A clip lead is provided for soldering to and supporting a first substrate vertically on a second substrate which may be horizontal. The terminal end of the clip is configured to form a stable support for the substrate during soldering in a vertical position to the second substrate by being bent at right angles to and extending under the first substrate.

5 Claims, 4 Drawing Sheets

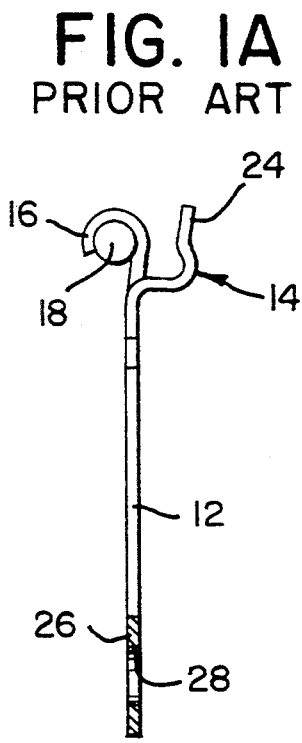
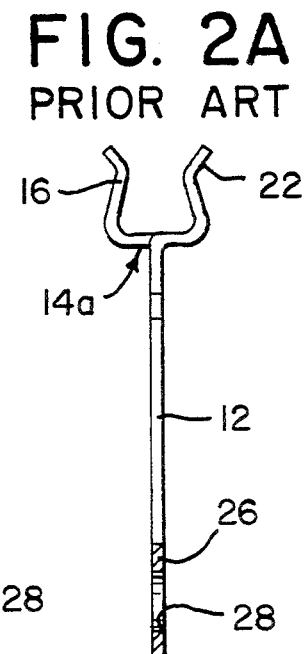
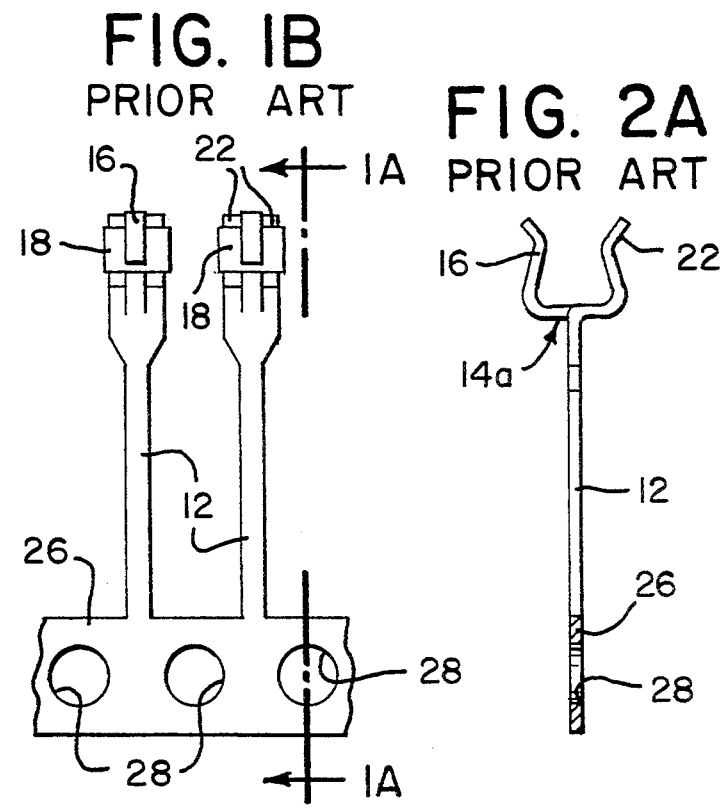
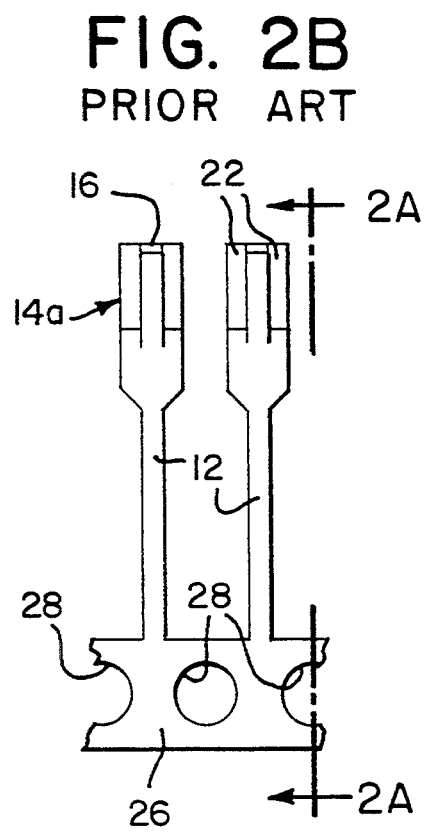
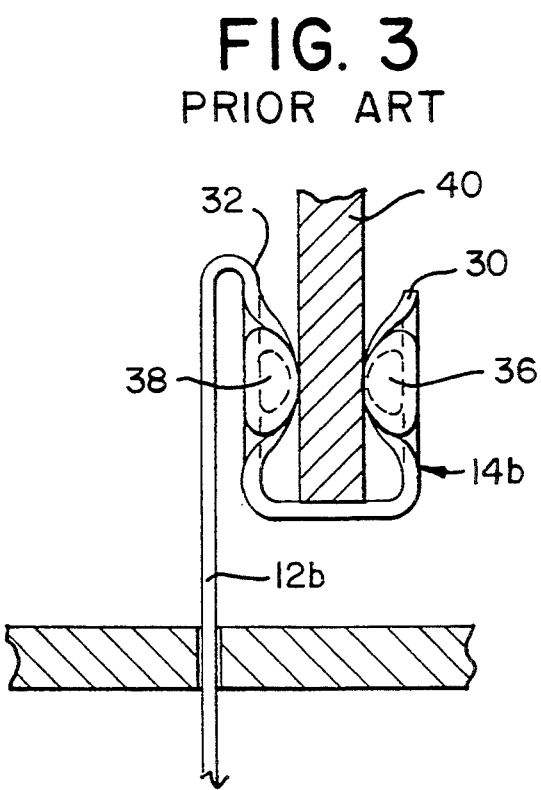

ELECTRICAL LEAD FOR SURFACE MOUNTING OF SUBSTRATES

FIELD OF THE INVENTION

This invention relates generally to electrical connectors or leads forming a clip and terminal for surface-mounting circuit-bearing boards, chips, chip carriers or other substrates, to a base printed circuit board or other substrate, perpendicular to the base substrate.

BACKGROUND OF THE INVENTION

Various leads providing a clip and terminal for mounting one substrate on another are known in the prior art. By way of example, U.S. Pat. No. 4,433,892 issued Feb. 28, 1984 to the assignee of the present application, discloses a lead having a clip for mounting a subsidiary substrate vertically on a base substrate, the lead having a terminal portion adapted to be retained and soldered in a hole in the base substrate. U.S. Pat. No. 4,697,865 issued Oct. 6, 1987 to the present assignee also discloses a clip lead for mounting a subsidiary substrate on a base substrate, in a within-the-hole manner, but parallel to the base substrate. A similar arrangement is shown in U.S. Pat. No. 4,592,617 granted Jun. 3, 1986 to the present assignee.

For commercial applications there is need for surface-mounting subsidiary substrates perpendicular to and on the surface of base substrates, in a manner which facilitates assembly and reduces the effects of shock and vibration.

SUMMARY OF THE INVENTION

It is a principal object of the present invention to provide a lead having a solderable edge clip for surface-mounting substrates on a base circuit-bearing substrate, where the lead is configured to reduce the effect of shock and vibration on the substrates.

A further object of the invention is to provide a lead with an edge clip for surface-mounting substrates on a printed circuit board, which enhances the stability of the lead during and after mounting it on the printed circuit board.

A still further object of the invention is to provide an array of leads with edge clips for surface-mounting a substrate on contact pads of a printed circuit board or other base substrate, in a manner increasing the stability of the array of leads during initial positioning on the base substrate and after soldering.

In one form the lead having a substrate-receiving clip is arranged with a terminal section which is coordinated with the gap of the clip portion so as to improve the stability of a mounted array of leads on a base substrate. In another form an array of leads is provided, each with a clip and a terminal section, where successive terminal sections along the array are bent in opposite directions to provide stability in surface-mounting the array on a printed circuit board or other substrate, and providing protection against the effects of shock and vibration.

BRIEF DESCRIPTION OF THE DRAWINGS

FIG. 1 is a side elevation view of one form of prior art edge clip lead for securing a substrate to a printed circuit board.

FIG. 1B is a plan view of a fragment of a ganged array or reel of edge clip leads as in FIG. 1A.

FIG. 2A is a side elevation view of another form of prior art edge clip lead for securing a substrate to a printed circuit board.

FIG. 3 is a plan view of a fragment of a ganged array or reel of edge clip leads as in FIG. 2A.

FIG. 3 is a side elevation view of yet another prior art edge clip lead for mounting a substrate on a printed circuit board.

DETAILED DESCRIPTION

Figure 4:
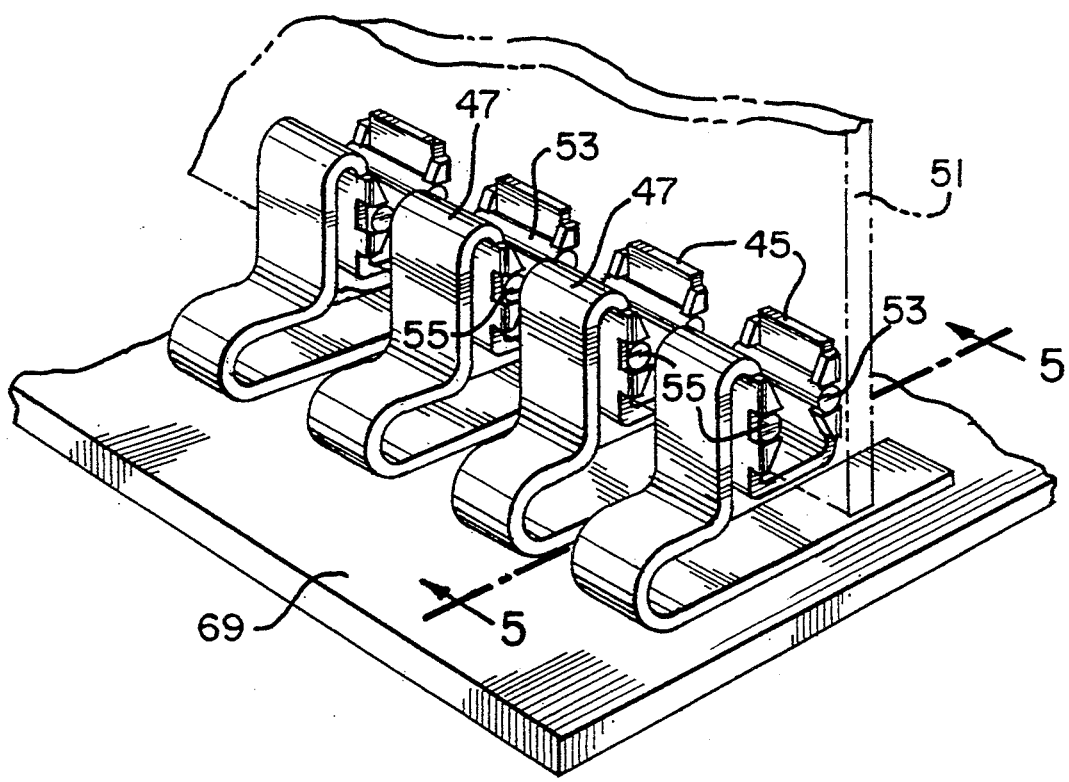
FIG. 4 is a perspective view of an array of one form of lead with clip according to the invention, showing how each lead surface-mounts a subsidiary substrate on a base substrate.

Referring to the drawings, FIGS. 1A and 1B illustrate a prior art lead (Part NAS-1023 of North American Specialties Corp.) for mounting a subsidiary substrate (such as a printed circuit board, integrated circuit chip, chip carrier or other substrate) vertically with respect to a base substrate (such as a printed circuit board or mother board). In this case the mounting on the base substrate is by through-the-hole soldering, where the terminal or distal end 12 of the lead, is inserted into a plated or metallized hole in the base substrate and soldered thereto. As seen in these figures, the lead has a clip 14 at one end. One arm 16 of the clip 14 (and in some instances both arms of the clip) carries a solder mass 18. The clip is formed by cutting out a central finger 20 from the body of the lead, which finger becomes the solder-retaining arm 16 of the clip, the remaining side portions 22 of the lead body forming the second arm 24 of the clip 14. The solder 18 is retained by curling the finger 20 clip around the solder mass 18, which may be a short section of solder wire, containing solder flux. In this instance the terminal portion 12 of the lead extends substantially in alignment with arm 16 of the clip. These leads are made by progressive stamping, in a continuous ganged array with each lead joined to a support or carrier strip 26 having sprocket or indexing holes 28 in conventional manner. This arrangement may under some conditions be subject to the disadvantage that the unbalanced positioning of a subsidiary substrate held in the clip 14 with respect to the mounting point for the terminal section 12 may cause an instability, so that shock or vibration which may be communicated to the subsidiary substrate may impair the solder joint between the clip 14 and the subsidiary substrate or between the terminal section 12 and the base substrate.

FIGS. 2A and 2B similarly illustrate another form of prior art clip lead (Part NAS-1041 of North American Specialties Corp.) in which the terminal portion 12 of the lead is centered with respect to the U-shaped clip 14a itself, providing a more symmetrical mounting for the subsidiary substrate on the base substrate.

FIG. 3 shows still another form of prior art edge clip lead (Part NAS-63 of North American Specialties Corp.) in which the clip portion 14b is formed by two parallel arms 30, 32 each bearing a solder mass 36, 38 in the manner disclosed in U.S. Pat. No. 4,728,305 granted Mar. 1, 1988 to North American Specialties Corp. In this case the lead is formed by bending a flat elongated narrow conductive body to provide the U-shaped clip 14b with a terminal section 12 integrally extending from one arm 32 of the clip and folded to be closely parallel to arm 32 to provide a terminal section 12a for mounting through a hole in a printed circuit board substrate. In this form also, the subsidiary substrate 40 is mounted off-center with respect to the lead terminal section 12b.

All of these leads are mounted through a hole on the base substrate, in contrast to the present invention which is arranged for surface-mounting the subsidiary substrate perpendicular to the base substrate.

Figure 5:
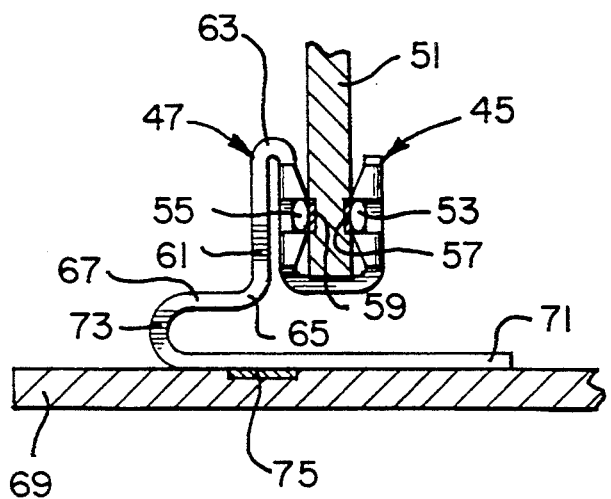
FIG. 5 is a cross-sectional view of the device of FIG. 4 seen along line 4—4 thereof.

FIGS. 4 and 5 show one form of the present invention designed to avoid the above-mentioned difficulties and to provide a more stable mounting for a subsidiary board perpendicularly on a base board. As shown in FIGS. 4 and 5, the lead according to the present invention is formed by bending an elongated narrow conductive body to provide a pair of parallel arms 45, 47 designed resiliently to embrace the subsidiary substrate 51 on either side. Each of the arms 47 carries a respective solder mass 53, 55 suitable for soldering to corresponding contact pads 57, 59 on the subsidiary substrate 51. The lead has a terminal portion extending from clip arm 47 formed in part by a first straight section 61 folded back on clip arm 47 by a 180-degree fold 63 so as to be closely parallel to arm 47. The terminal portion is again bent through a 90-degree bend 65 to provide second or intermediate straight section 67 generally parallel to the base substrate 69. The second section 61 is joined to a final terminal section 71 by a 180-degree bend 73. The terminal section 71 is arranged to provide stability by extending both to the left and right of the center plane of the clip so that tilting movements of the lead and its supported substrate 51 are inhibited. The terminal section 71 is suitably secured to the base substrate 60 as, for example, by providing solder paste between the terminal section 71 and a contact pad 75 on the base substrate 69 and soldering the terminal section 71 thereby to the contact pad.

Figure 6A:
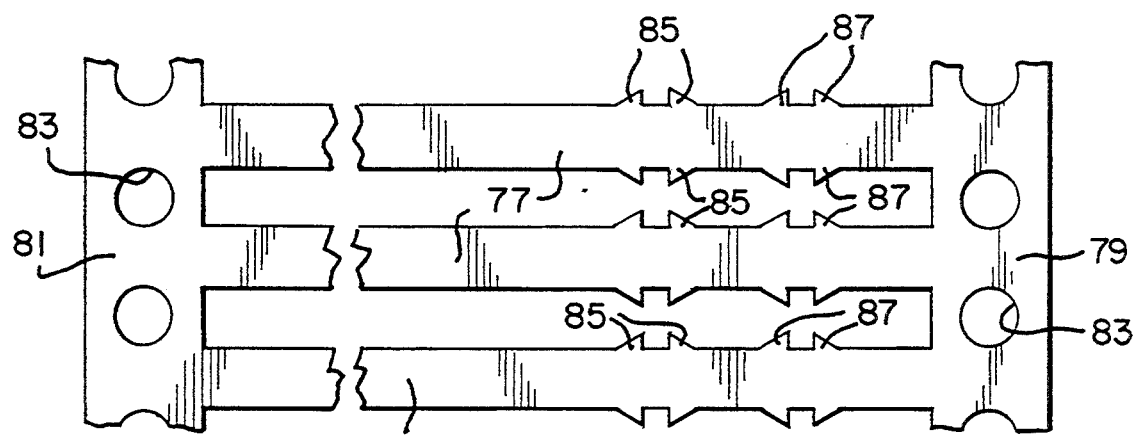
FIG. 6A is a plan view of a partially formed blank for an array of leads as in FIGS. 4 and 5.
Figure 6B:
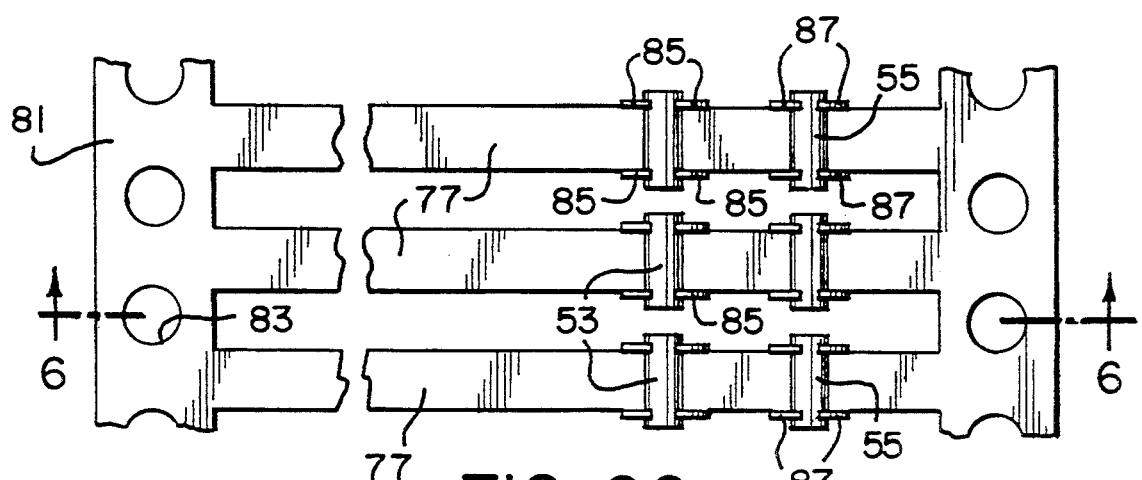
FIG. 6B is a plan view of a partially formed array of leads as in FIGS. 4 and 5, at a later stage of fabrication than in FIG. 6A.
Figure 6C:
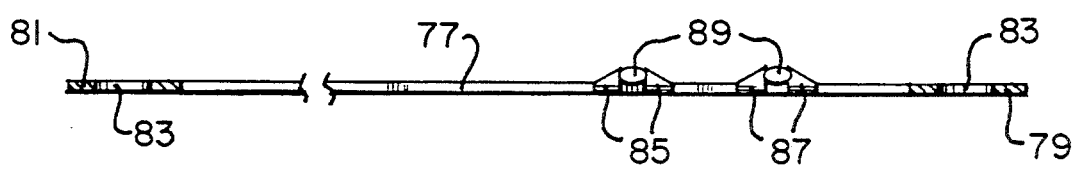
FIG. 6C is a cross-sectional side elevation view of the structure of FIG. 6B seen along line 6—6 thereof.
Figure 6D:
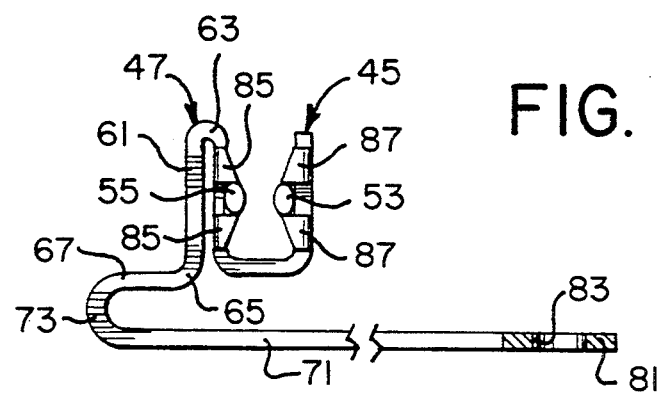
FIG. 6D is a cross-sectional side elevation view of an array of leads as in FIGS. 4 and 5, before severing from a carrier strip.

FIGS. 6A to 6D illustrate various stages during fabrication of the lead of FIGS. 4 and 5, which may be formed by conventional multi-stage progressive stamping. Thus, a wide band of conductive resilient material (e.g. of beryllium copper) is stamped to form the intermediate blank of FIG. 6A, having a multiplicity of flat narrow elongated lead bodies 77 extending between two carrier strips 79 and 81, each carrier strip having customary indexing or sprocket holes 83 for advancing the band through the stages of a progressive stamping apparatus. Although not preferred in some case a single carrier strip 81 may be used. In one arrangement, as shown, each lead body 77 is formed with two pairs of tabs 85, 87 on each of its edges. As shown in FIG. 6B and 6C, these tabs 85, 87 are then turned at right angles to the plane of the lead body strip 77 and a solder mass (e.g. a wire section) 53, 55 is placed between pairs of tabs 85, 87 and held in place by staking or crimping the tabs to the solder mass. It will be understood that other known arrangements for holding the solder to the clip arms may be used, where desired. The carrier strip 79 is removed by cutting or breaking off and the lead body strip 77 is bent into the shape shown in FIG. 6D, with the carrier strip 81 still attached. In this way a comb-like array or strip of clip leads is provided, each attached to and supported by the carrier strip 81 as shown in FIG. 6D. The array is essentially endless, and may have several thousand leads connected to the same carrier strip, and rolled up in a reel for convenient handling or automated assembly to subsidiary substrates.

A series of ganged leads of the appropriate number (e.g. 5 to 20), corresponding to the number and spacing of contact pads on an edge of the substrate 51, may then be cut from the complete reel of leads with the carrier strip 81 still attached and supporting the leads. The edge of the substrate 51 is then inserted into the lead clips, with each lead solder mass in contact with a contact pad 57 or 59. The resilience of the clips holds the lead array on the substrate 51 during subsequent handling including heating and cooling which solders each lead to its contact pad both electrically and mechanically. The carrier strip 81 is then cut off. The subsidiary substrate 51, holding its soldered leads, is then placed onto the substrate 69 with each lead terminal in contact with a respective contact pad 71 and soldered to the contact pads of substrate 69 in conventional manner.

The relatively long terminal section 71, extending beyond the clip arms 45, 47 on either side of their center line, provides good stability for the lead array section and connected subsidiary substrate when placed on the base substrate 69 for soldering and during the soldering operation.

The vertical mounting of the subsidiary substrate at its lower edge creates opportunity for shock or vibration to produce tilting forces between the subsidiary and base substrates, which in prior art clip arrangements have a tendency to impair the soldered joints. This effect is reduced by the present invention. The bend 73 provides a resilient shock-absorbing arrangement so that shock or vibration communicated to the base substrate 69 will not be communicated to the subsidiary substrate 51 and vice versa. In addition, the extension of the distal terminal section 71 beyond the clip center line on both sides provides a stable support for the subsidiary substrate 51 when placed on the base substrate 69 and during and after their soldering together. This arrangement therefore provides both a stable mounting during assembly and a shock-absorbing and stable mounting for the subsidiary substrate after soldering.

Figure 7:
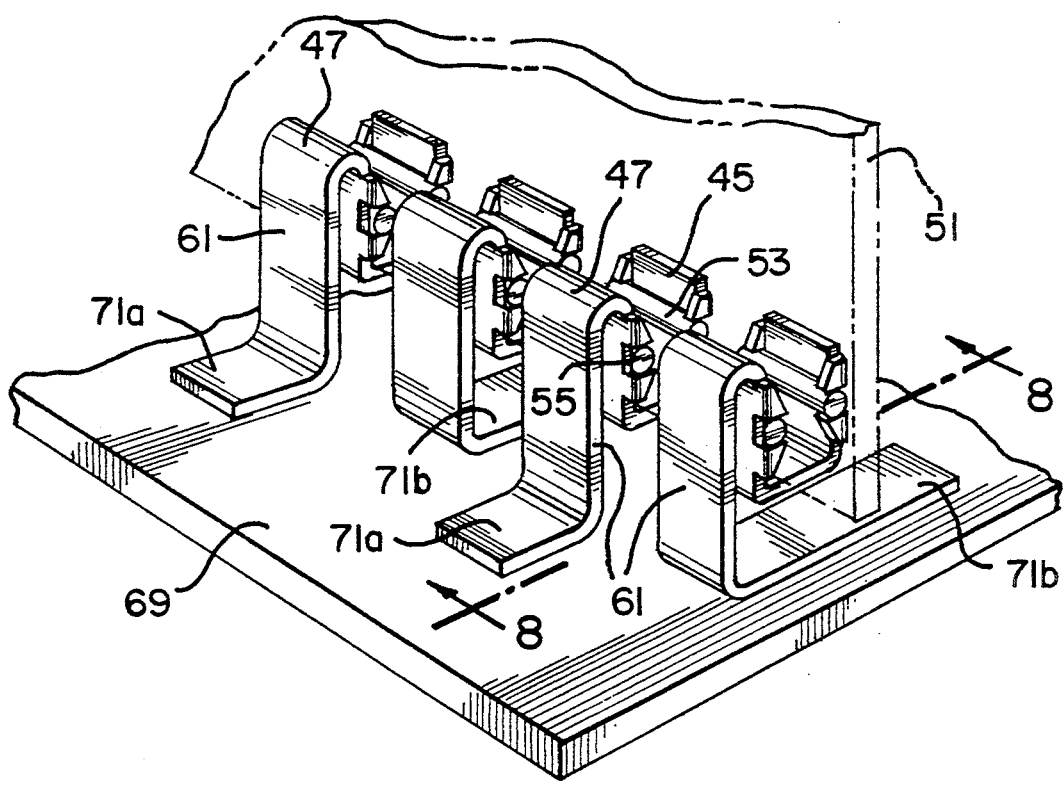
FIG. 7 is a perspective view of a modified form of the present invention where alternate leads have terminal sections extending in opposite directions.
Figure 8:
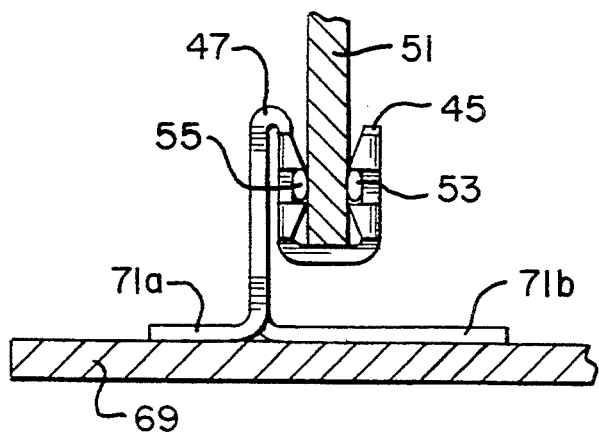
FIG. 8 is a cross-sectional view of the device of FIG. 7 taken along line 8—8 thereof.

FIGS. 7 and 8 illustrate a modified form of the present invention where the leads are applied to the substrates in the same manner described above. Corresponding elements are given the same reference numerals as in the case of FIGS. 4 to 6. In this form, alternate leads along an array such as illustrated in FIG. 6C have their first section 61 bent directly at right angles to form the terminal section 71a or 71b. Alternate ones of the array of leads have their terminal sections 71a, 71b bent in opposite directions. In this way the two oppositely bent terminal sections 71a and 71b provide stability for maintaining the lead array in position on the base substrate 69 for and during soldering as well as maintaining stability for the subsidiary substrate 51 after soldering as described above.

While FIGS. 4-8 show solder mounted on both arms of the clip, where desirable solder may be provided on only one arm. Also, while the present invention has disclosed particular ways of holding solder on the arms of the clip, it is to be understood that various other ways may be utilized, as may be desired, such as those shown, for example, in U.S. Pat. No. 4,592,617 granted Jun. 3, 1986 to the assignee of the present application, or as shown in the prior art configurations of FIGS. 1 to 3.

Accordingly, the present invention provides leads for surface-mounting a subsidiary substrate at right angles to a base substrate, with added stability during mounting and shock and vibration resistance after mounting to reduce possible cracking in the soldered joint. The present arrangement moreover provides improved resilient gripping of the subsidiary substrate by the clip, since the full width of the body strip is utilized as the clip arms rather than narrower fingers cut out of the body strip. This holds the substrate to a better degree during its mounting and soldering.

What is claimed as the invention is:

1. A lead having a clip and terminal for surface-mounting a first substrate perpendicularly to a second substrate, comprising:

an elongated flat strip of conductive resilient material, said strip having adjacent one end a U-shaped configuration with first and second substantially parallel side arms and a joining section forming a clip, at least one side arm carrying a solder mass on its side facing the other side arm, said clip being adapted to engage a first substrate having a contact pad in register with said solder mass, said strip having a first straight section joined to said clip first arm and folded to be substantially parallel to said clip arms, said strip having a terminal straight section substantially at right angles to said first section and to said clip arms, and adapted to be surface-mounted on a second substrate, said terminal straight section being longer than said clip-joining section and extending beyond said clip on either side thereof.

2. A lead as in claim 1 wherein said terminal section is joined to said first section by a curved section and extends beyond said clip on either side thereof, whereby said curved section provides a shock-absorbing mounting for said first substrate when said terminal section is surface-mounted on a second substrate.

3. An array of leads as in claim 1 where each clip has its second arm joined to a carrier strip, certain of said terminal sections extending in a direction opposite to others of said terminal sections, whereby said array may be positioned in stable manner on said second substrate for soldering thereto.

4. An array of leads as in claim 3 wherein alternate ones of said terminal sections extend in opposite directions.

5. A clip and terminal for surface mounting a subsidiary substrate substantially perpendicularly on a base substrate comprising an elongated body of conductive resilient material, said body having adjacent one end a U-shaped configuration with a pair of side arms and a joining section, each side arm carrying a solder mass on its side facing the other side arm, said U-shaped configuration being adapted to engage a first substrate with said solder masses in register with contact pads on said first substrate, said strip having a first section joined to one of said clip arms and folded to be substantially parallel to said clip arm, said strip having a second section substantially at right angles to said first section and said clip arms, said second section being joined to said first section by a third curved section, whereby said third section provides a shock-absorbing mounting for said clip when said second section is secured to a base substrate, said second section extending beyond said clip on either side thereof.

* * * * *